(12) United States Patent
Kim

(10) Patent No.: US 7,666,740 B2
(45) Date of Patent: Feb. 23, 2010

(54) NONVOLATILE SEMICONDUCTOR MEMORY DEVICE TO REALIZE MULTI-BIT CELL AND METHOD FOR MANUFACTURING THE SAME

(75) Inventor: Dong-Oog Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 190 days.

(21) Appl. No.: 11/854,676

(22) Filed: Sep. 13, 2007

(65) Prior Publication Data

US 2008/0087936 A1   Apr. 17, 2008

(30) Foreign Application Priority Data

Oct. 11, 2006   (KR) ............. 10-2006-0098760

(51) Int. Cl.
*H01L 21/336* (2006.01)

(52) U.S. Cl. .............. 438/261; 257/E21.179; 257/E21.422; 257/E21.682; 438/201; 438/264; 438/265

(58) Field of Classification Search .......... 257/E21.179, 257/E21.422, E21.68, E21.681, E21.682; 438/201, 211, 257, 261, 264, 265, 593
See application file for complete search history.

(56) References Cited

U.S. PATENT DOCUMENTS

| | | | | |
|---|---|---|---|---|
| 5,021,999 A | * | 6/1991 | Kohda et al. | 365/185.03 |
| 5,278,439 A | * | 1/1994 | Ma et al. | 257/319 |
| 5,714,412 A | * | 2/1998 | Liang et al. | 438/266 |
| 5,812,449 A | * | 9/1998 | Song | 365/185.03 |
| 6,097,059 A | * | 8/2000 | Yamada | 257/321 |
| 6,133,098 A | * | 10/2000 | Ogura et al. | 438/267 |
| 6,248,633 B1 | * | 6/2001 | Ogura et al. | 438/267 |
| 6,424,002 B1 | * | 7/2002 | Kondo et al. | 257/316 |
| 6,566,707 B1 | * | 5/2003 | Sudo et al. | 257/316 |
| 6,593,187 B1 | * | 7/2003 | Hsieh | 438/257 |
| 6,686,632 B2 | * | 2/2004 | Ogura et al. | 257/374 |
| 7,045,854 B2 | * | 5/2006 | Osabe et al. | 257/317 |
| 7,268,385 B2 | * | 9/2007 | Nishizaka et al. | 257/315 |
| 7,499,336 B2 | * | 3/2009 | Liu et al. | 365/185.28 |
| 2004/0264270 A1 | * | 12/2004 | Iwata et al. | 365/200 |
| 2007/0052007 A1 | * | 3/2007 | Jung | 257/315 |

* cited by examiner

*Primary Examiner*—Anh Phung
*Assistant Examiner*—Michael Lulis
(74) *Attorney, Agent, or Firm*—Sherr & Vaughn, PLLC

(57) ABSTRACT

A nonvolatile semiconductor memory device that realizes a multi-bit cell and a method for manufacturing the same includes manufacturing the nonvolatile semiconductor memory device to be capable of storing multi-bit data, for example, 4-bit data, in a single memory cell and, as a result, the integration degree of a NOR type nonvolatile semiconductor memory device can be improved.

11 Claims, 6 Drawing Sheets

Figure 1:
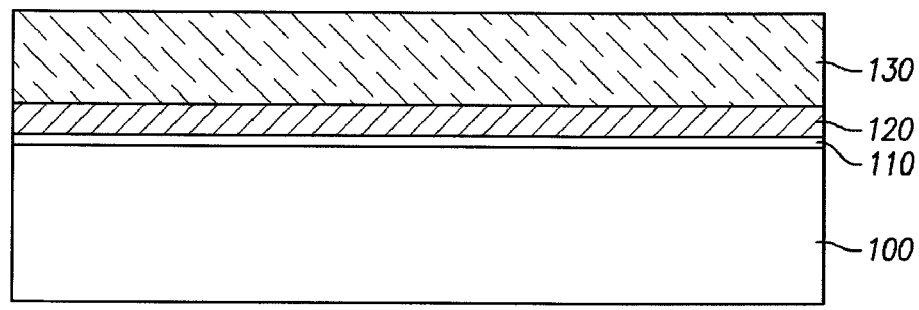

NONVOLATILE SEMICONDUCTOR MEMORY DEVICE TO REALIZE MULTI-BIT CELL AND METHOD FOR MANUFACTURING THE SAME

This application claims the benefit under 35 U.S.C. §119 of the Korean Patent Application No. 10-2006-0098760, filed on Oct. 11, 2006, which is hereby incorporated by reference in its entirety.

BACKGROUND

Among various high-integration nonvolatile memory devices, a flash electrically erasable programmable read-only memory (EEPROM) device has particular advantages of, for example, high programming speed and low electricity consumption. As a result they are used as a large-capacity storage medium for portable terminals such as a digital camera, portable personal computer, etc., or used in place of a conventional hard disc.

Flash EEPROM devices may be generally classified, on the basis of a memory cell structure, into NAND-structure devices and NOR-structure devices. The NAND-structure devices have superior characteristics in the view of an integration degree, whereas the NOR-structure devices have superior random access time characteristics. In the NOR-structure devices, each of memory cells is independently connected to a bit line and a word line, and therefore, there is an advantage in that each cell interferes with other cells less during a writing operation or reading operation thereof.

However, the NOR-structure devices require a contact for the inter-connection of each cell and a corresponding bit line. For this reason, the NOR-structure devices are disadvantageous in the view of an integration degree (i.e., decreasing size), as compared to the NAND-structure devices, which require only one contact per a single string, i.e. a single unit consisting of a plurality of cells connected to one another in series.

SUMMARY

Embodiments relate to a NOR-type non-volatile semiconductor memory device that includes a plurality of memory cells, wherein each cell is configured to store multi-bit data.

Embodiments relate to a nonvolatile semiconductor memory device that includes (a) a semiconductor substrate having a plurality of source/drain regions; (b) a spacer structure provided on either side end of each of the source/drain regions; (c) contacts and source lines alternately arranged on the source/drain regions; (d) control gates in contact with the spacer structure between the contacts and the source lines;(e) a poly metal dielectric (PMD) layer formed on the source lines surrounding the respective contacts; and (f) a metal wiring layer provided on the contacts and the PMD layer.

Embodiments relate to a method for manufacturing a nonvolatile semiconductor memory device. In accordance with this method, the following steps are performed: (a) sequentially forming a first oxide layer, a first poly-silicon layer, and a first insulation layer on a semiconductor substrate; (b) implanting a dopant into the semiconductor substrate, which is exposed by an etching process performed using a photoresist pattern provided on the first insulation layer, to form source/drain regions; (c) performing a re-oxidation process to form a second oxide layer on the source/drain regions; (d) forming first spacers on the second oxide layer at opposite sides of the second oxide layer; (e) filling a second insulation layer between the neighboring first spacers, and removing the second insulation layer on the source regions; (f) forming source lines on the respective source regions from which the second insulation layer was removed; (g) forming second spacers to come into contact with the respective first spacers after removing the first insulation layer; (h) forming an upper silicon oxide layer on the source lines and forming a lower silicon oxide layer on an underside between the neighboring second spacers; (i) forming control gates between the neighboring second spacers; (j) performing a salicide process to reduce a resistance of the control gates; (k) forming a poly metal dielectric (PMD) layer covering the control gates, and planarizing the PMD layer by a chemical mechanical polishing (CMP) process; and (l) filling an electrically conductive material in a plurality of contact holes perforated through the PMD layer and the second insulation layer, to form contacts.

DRAWINGS

Example FIGS. 1 to 12 are sectional views illustrating the sequential processes of a method for manufacturing a nonvolatile semiconductor memory device to realize a multi-bit cell according to embodiments described herein.

DESCRIPTION

Embodiments relate to a technology for storing multi-bit data in a single memory cell to improve the integration degree of the flash EEPROM devices.

First, as shown in example FIG. 1, a first oxide layer 110, a first poly-silicon layer 120, and a first insulation layer 130 are sequentially formed on a semiconductor substrate 100. The first oxide layer 110 may be made of any one selected from among a $SiO_2$, SiON, $La_2O_3$, $ZrO_2$, and $Al_2O_3$ layer, or may be formed by laminating at least two layers selected from among them. The first oxide layer 110 may be formed, by growth or deposition, to have a thickness of approximately 30 Å to approximately 300 Å, and the first poly-silicon layer 120 is formed to have a thickness of approximately 100 Å to approximately 1,500 Å by depositing poly-silicon for the formation of floating gates. Also, the first insulation layer 130 may be made of an oxide layer of $SiO_2$ or a nitride layer of SiN.

Figure 2:
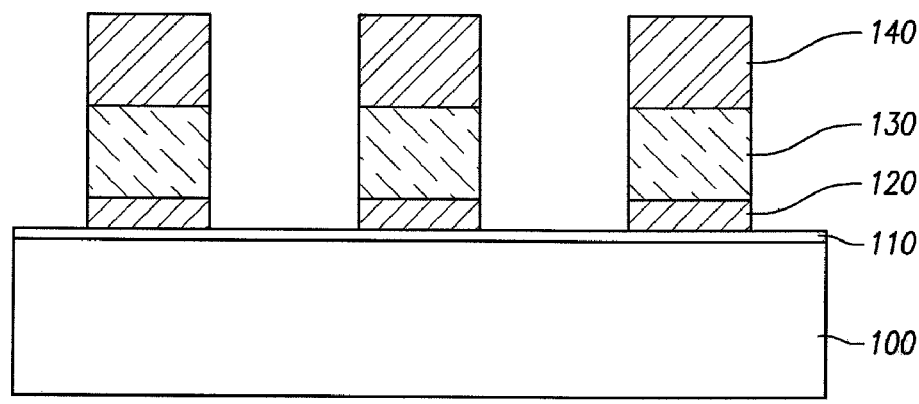

Next, as shown in example FIG. 2, a photoresist pattern 140 is provided on the first insulation layer 130 to define source/drain regions. After an etching process is performed using the photoresist pattern 140 to expose the semiconductor substrate 100 by removing predetermined regions of the first insulation layer 130, the first poly-silicon layer 120, and even the first oxide layer 110 on the semiconductor substrate 100, a dopant can be implanted into the resulting exposed regions of the semiconductor substrate 100 to form source/drain regions 150. Here, the etching process using the photoresist pattern 140 may be performed to remove only the first insulation layer 130 and the first poly-silicon layer 120 without removing the first oxide layer 110, to expose the first oxide layer 110.

After implanting the dopant to form the source/drain regions 150 and performing a cleaning process, an annealing process is performed at a temperature of approximately 1,000° C. to approximately 1,100° C., to prevent unwanted diffusion of the dopant implanted when forming the source/drain regions 150.

Figure 3:
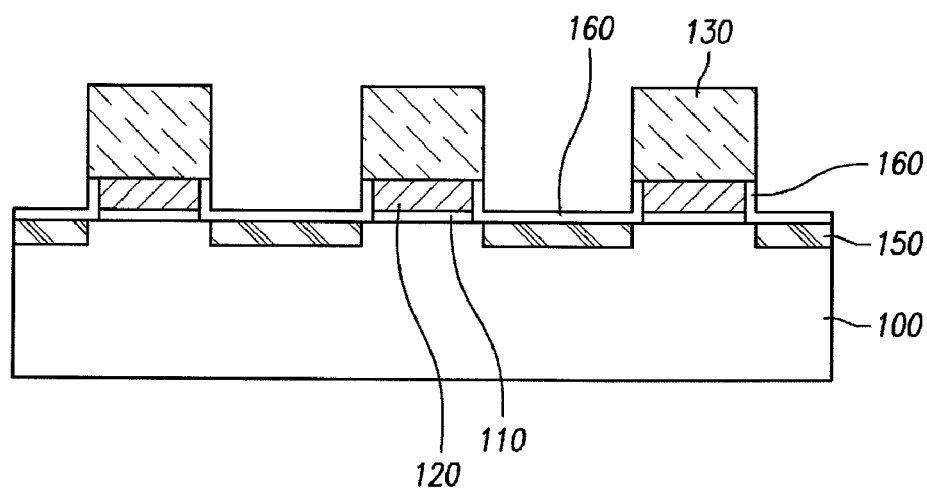
Figure 4:
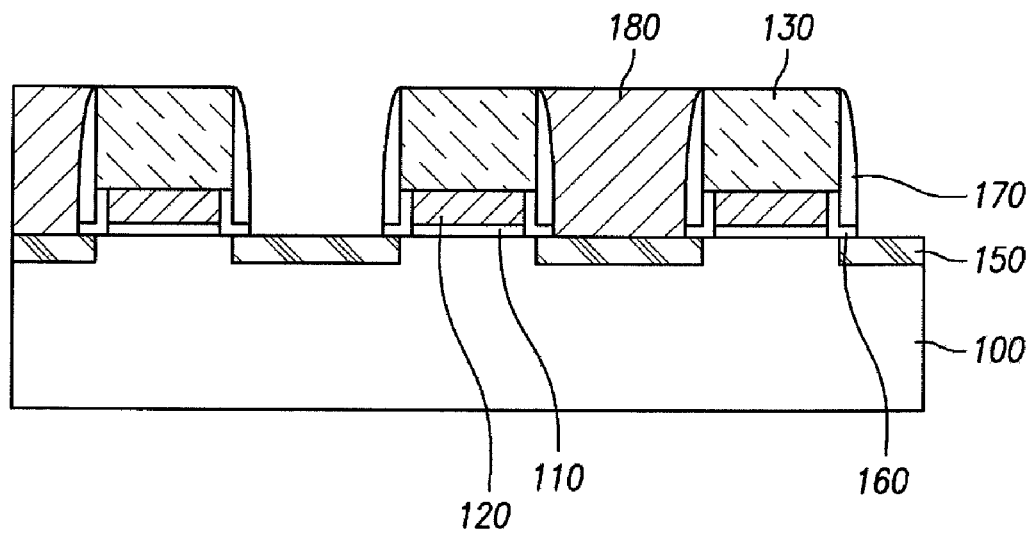

After completing the annealing process, as shown in example FIG. 3, a re-oxidation process is performed to form a second oxide layer 160 on the source/drain regions 150. Thereby, the second oxide layer 160 can be formed to have a thickness of approximately 90 Å to approximately 110 Å.

After forming the second oxide layer 160, an oxide layer of $SiO_2$ or a nitride layer of $Si_3N_4$ is deposited on the semiconductor substrate 100. As the deposited $SiO_2$ or $Si_3N_4$ layer is subjected to an etch-back process, first spacers 170 as shown in example FIG. 4 can be formed. Then, a second insulation layer 180 is deposited on the overall surface of the semiconductor substrate 100 to perform a gap-fill process. The gap-filled second insulation layer 180 is planarized by an etch-back process, and subsequently, is etched using a source-open mask (not shown) to open the source regions. Thereby, the second insulation layer 180 on the source regions is removed. Alternatively, the second insulation layer 180 may be planarized by a chemical mechanical polishing (CMP) process rather than the etch-back process.

Figure 5:
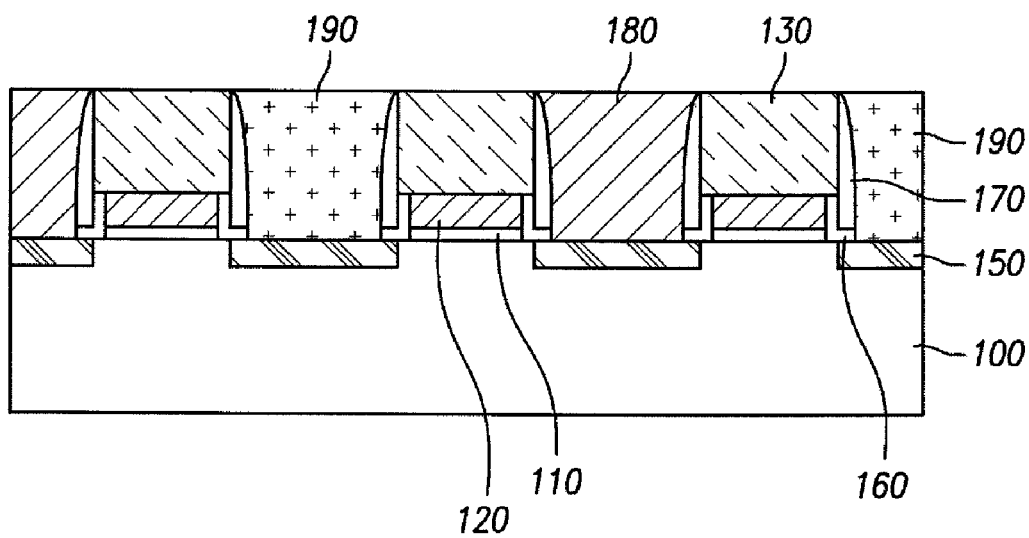

After removing the second insulation layer 180 on the source regions, as shown in example FIG. 5, an electrode material, for example, doped poly-silicon to form source lines 190 is deposited on the source regions to perform a gap-fill process. The gap-filled doped poly-silicon is planarized by an etch-back process, to form the source lines 190.

Figure 6:
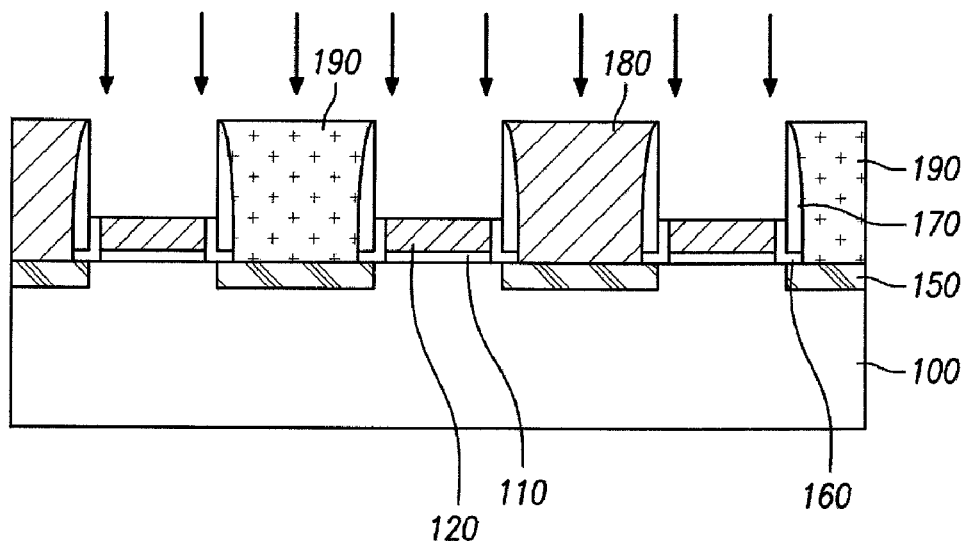
Figure 7:
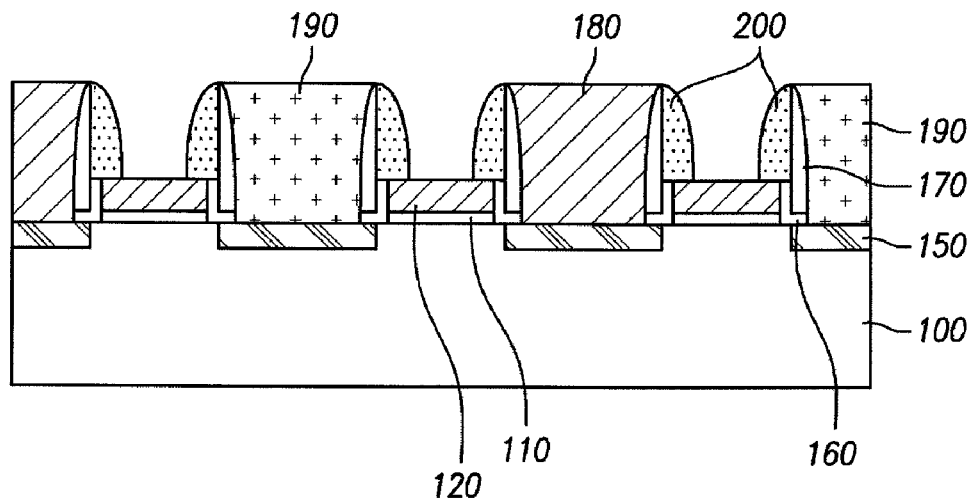
Figure 8:
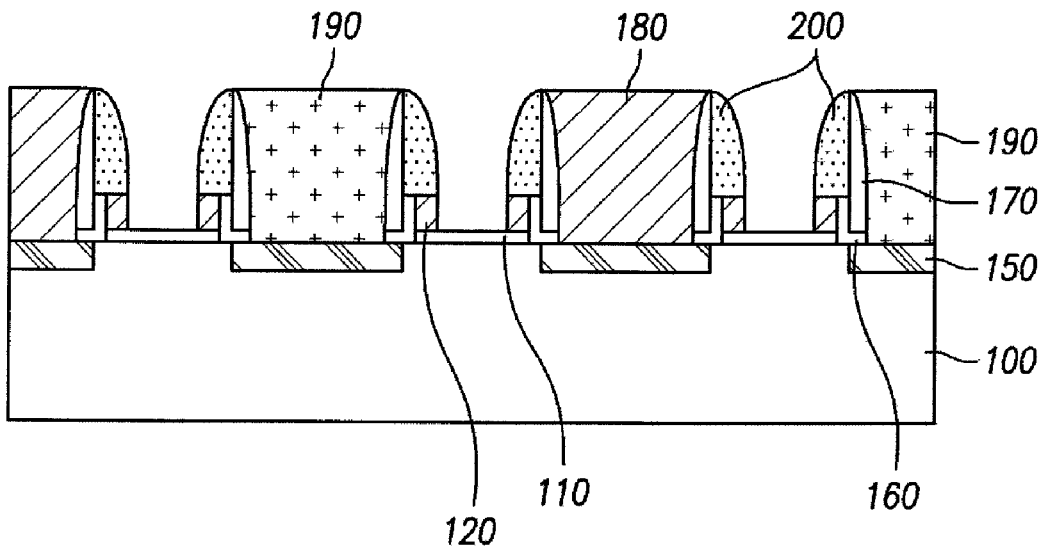

After forming the source lines 190, as shown in example FIG. 6, a predetermined etching process is performed to remove the first insulation layer 130, and a n-type dopant such as arsenic (As) or phosphorus (P) is implanted to give the first poly-silicon layer 120 the characteristics of floating gates.

After implanting the n-type dopant, an oxide layer of $SiO_2$ or a nitride layer of $Si_3N_4$ layer is deposited on the first poly-silicon layer 120. The deposited $SiO_2$ or $Si_3N_4$ layer is subjected to an etch-back process, to form second spacers 200 as shown in example FIG. 7. Subsequently, a dry etching process, such as a reactive ion etching (RIE), is performed on the first poly-silicon layer 120 having the second spacers 200 formed thereon. With the dry etching process, as shown in example FIG. 8, the first oxide layer 110 as well as the first poly-silicon layer 120 can be etched, and then, a cleaning process is performed.

Figure 9:
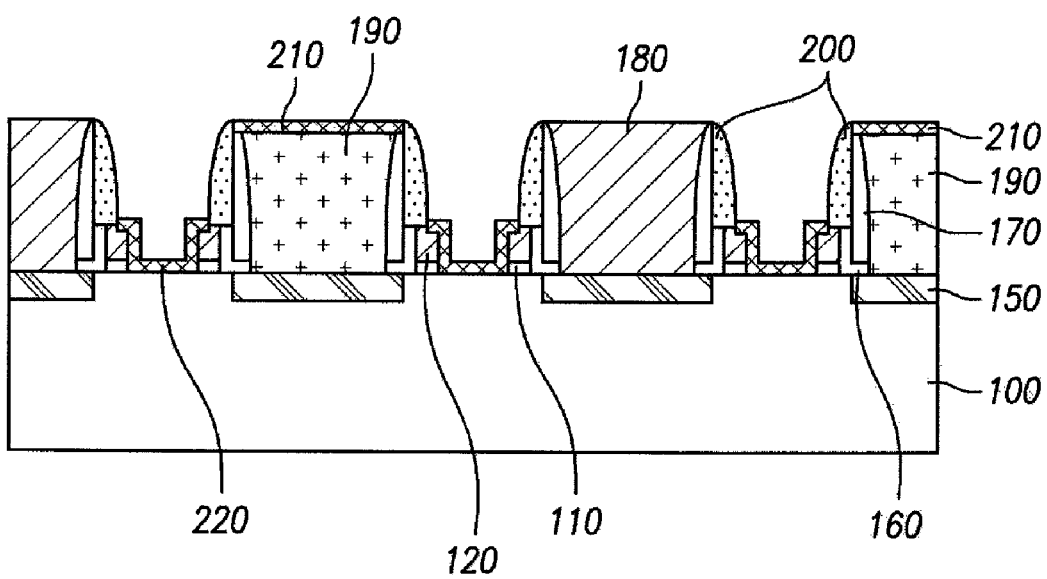

After forming a pattern by etching even the first oxide layer 110, as shown in example FIG. 9, a predetermined oxidation process is performed, to form an upper silicon oxide layer 210 on the source lines 190, and a lower silicon oxide layer 220 on the pattern obtained by etching the first oxide layer 110 as well as the first poly-silicon layer 120.

Figure 10:
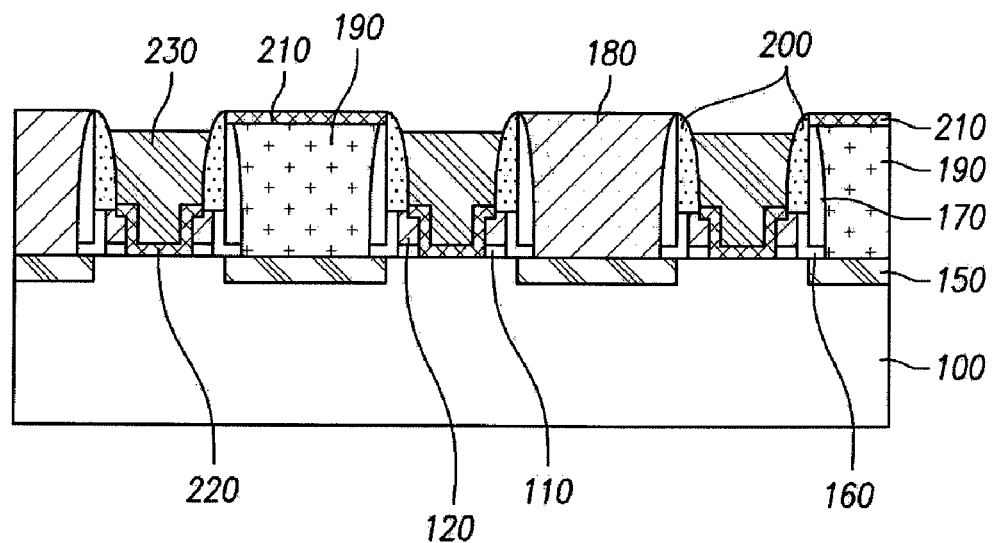

After forming the silicon oxide layers 210 and 220, to form control gates 230 as shown in example FIG. 10, a control gate material, for example, at least one material selected from among poly-silicon, tungsten (W), silicon germanium (SiGe), silicon germanium carbide (SiGeC), molybdenum (Mo), molybdenum salicide ($MoSi_2$), titanium (Ti), titanium salicide ($TiSi_2$), and titanium nitride (TiN), is deposited on the lower silicon oxide layer 220 to perform a gap-fill process between the second spacers 200. Preferably, poly-silicon is used as a gap-fill material. As the control gate material, gap-filled between the second spacers 200, is planarized by an etch-back process, the control gates 230 can be formed.

Figure 11:
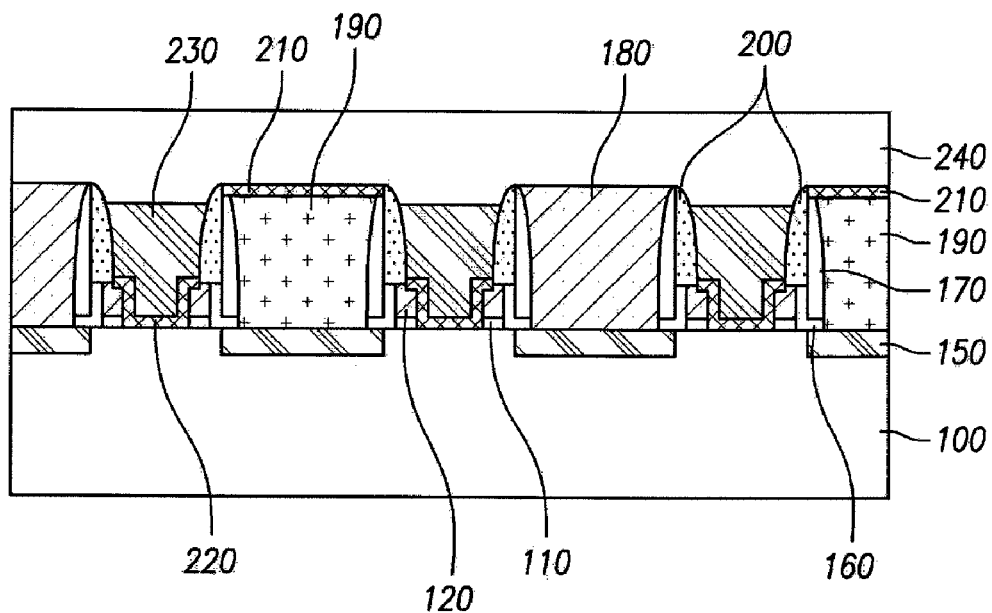

After forming the control gates 230, as shown in example FIG. 11, a general salicide process, for example, using cobalt (Co) and TiN, is performed to reduce a resistance of the control gates 230, and subsequently, an annealing process is performed at a temperature of approximately 400° C. to approximately 500° C. Then, a poly-metal dielectric (PMD) layer 240 is formed using a boron phosphorus silicate glass (BPSG), phosphorus silicate glass (PSG), or the like, and a surface of the PMD layer 240 is planarized by a CMP process.

After flattening the PMD layer 240, a predetermined photoresist pattern (not shown) is provided on the PMD layer 240. The PMD layer and the second insulation layer 180 are etched using the predetermined photoresist pattern, to form contact holes.

Figure 12:
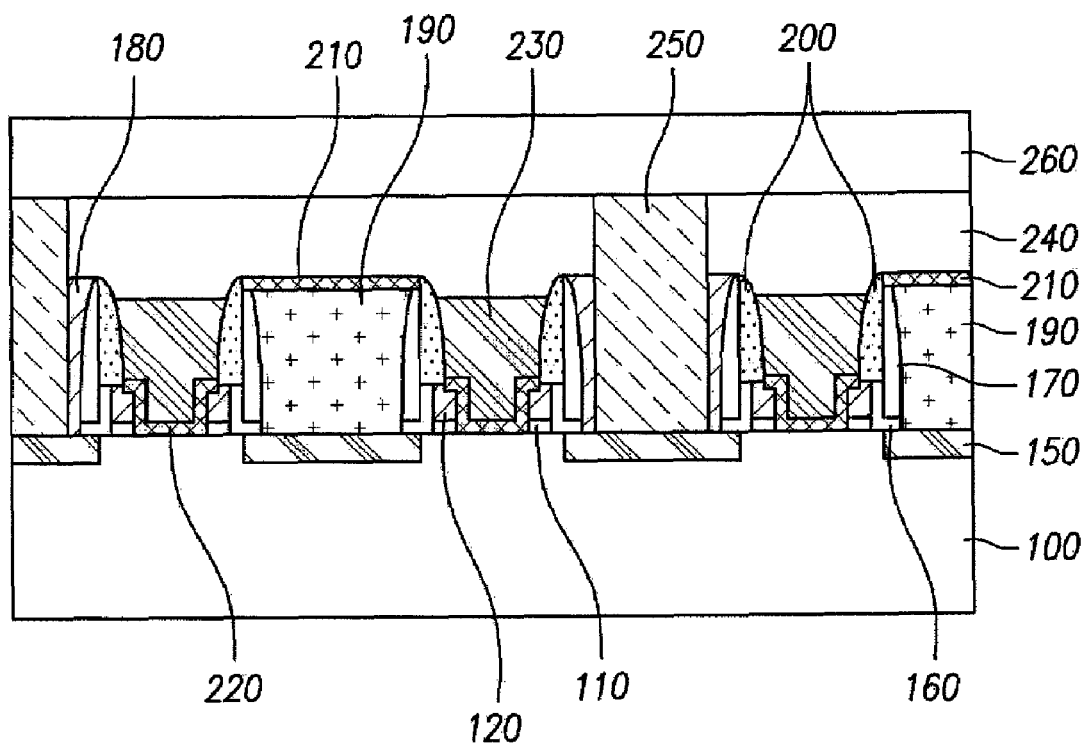

In relation to the contact holes formed as stated above, as shown in example FIG. 12, a barrier layer (not shown) made of, for example, titanium tantalum nitride (TiTaN), is formed at the sidewall of the respective contact holes, and a material such as tungsten is filled in the contact holes, to form contacts 250. Of course, after forming the contacts 250, a CMP process may be performed to planarize the PMD layer 240 having the contacts 250 formed therein.

Thereafter, a metal wiring layer 260, which is made of electrically conductive metal, for example, aluminum (Al), is formed on the PMD layer 240 having the contacts 250 by a general chemical vapor deposition (CVD) or physical vapor deposition (PVD) method.

As shown in example FIG. 12, each of the contacts 250 are located between the neighboring source lines 190, and consequently, the contacts 250 and the source lines 190 are periodically formed and alternately arranged with each other.

Using the above-described embodiments, a nonvolatile semiconductor memory device, in which a single memory cell stores multi-bit data, for example, 4-bit data, can be manufactured, thereby improving the integration degree of a NOR type nonvolatile semiconductor memory device. In particular, since the nonvolatile semiconductor memory device operates using the gap-filled source lines 190, the embodiments have the effect of eliminating a conventional self-aligned source (SAS) process, and reducing diffusion resistance. The reduced diffusion resistance results in a reduced resistance of the source lines 190 which improves the margin of cell current.

What is claimed is:

1. A method for manufacturing a nonvolatile semiconductor memory device comprising:

sequentially forming a first oxide layer, a first poly-silicon layer, and a first insulation layer on a semiconductor substrate;

implanting a dopant into the semiconductor substrate, which is exposed by an etching process performed using a photoresist pattern provided on the first insulation layer, to form source/drain regions;

performing a re-oxidation process to form a second oxide layer on the source/drain regions;

forming first spacers on the second oxide layer at opposite sides of the second oxide layer;

filling a second insulation layer between the neighboring first spacers, and removing the second insulation layer on the source regions;

forming source lines on the respective source regions from which the second insulation layer was removed;

forming second spacers to come into contact with the respective first spacers after removing the first insulation layer;

forming an upper silicon oxide layer on the source lines and forming a lower silicon oxide layer on an underside between the neighboring second spacers;

forming control gates between the neighboring second spacers;

performing a salicide process to reduce a resistance of the control gates;

forming a poly metal dielectric (PMD) layer covering the control gates, and planarizing the PMD layer by a chemical mechanical polishing (CMP) process; and filling an electrically conductive material in a plurality of contact holes perforated through the PMD layer and the second insulation layer, to form contacts.

2. The method according to claim 1, further comprising:
forming a metal wiring layer on the PMD layer and the contacts.

3. The method according to claim 1, wherein:
the first oxide layer is made of at least one material selected from among $SiO_2$, $SiON$, $La_2O_3$, $ZrO_2$, and $Al_2O_3$, and has a thickness of approximately 30 Å to approximately 300 Å; and
the first poly-silicon layer has a thickness of approximately 100 Å to approximately 1,500 Å.

4. The method according to claim 1, wherein forming the first spacers comprises:
forming a silicon oxide layer or silicon nitride layer on the second oxide layer; and
performing an etch-back process on the silicon oxide layer or silicon nitride layer.

5. The method according to claim 1, wherein forming the source lines comprises:
gap-filling doped poly-silicon in the source regions from which the second insulation layer was removed; and
planarizing the gap-filled doped poly-silicon by an etch-back process.

6. The method according to claim 1, wherein the control gates are made of at least one material selected from poly-silicon, tungsten (W), silicon germanium (SiGe), silicon germanium carbide (SiGeC), molybdenum (Mo), molybdenum salicide ($MoSi_2$), titanium (Ti), titanium salicide ($TiSi_2$), and titanium nitride (TiN).

7. The method according to claim 1, wherein the control gates are formed between the neighboring second spacers by a gap-fill process, and are planarized by an etch-back process.

8. The method according to claim 1, wherein the PMD layer is formed using a boron phosphorus silicate glass (BPSG) or phosphorus silicate glass (PSG).

9. The method according to claim 1, wherein the source lines and the contacts are periodically formed and alternately arranged with each other.

10. The method according to claim 1, wherein forming the contacts comprises:
forming a barrier layer made of titanium tantalum nitride (TiTaN) at a sidewall of respective contact holes; and
filling the electrically conductive material in the contact holes having the barrier layer.

11. The method according to claim 1, wherein when removing the second insulation layer on the source regions, the second insulation layer on the source regions is etched and removed using a source-open mask to open the source regions.

* * * * *